United States Patent
Chen et al.

(10) Patent No.: US 11,925,061 B2
(45) Date of Patent: Mar. 5, 2024

(54) FLEXIBLE DISPLAY PANEL AND ELECTRONIC DEVICE

(71) Applicant: Wuhan China Star Optoelectronics Semiconductor Display Technology Co., Ltd., Hubei (CN)

(72) Inventors: Jianfeng Chen, Hubei (CN); Shuyuan Zhang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 386 days.

(21) Appl. No.: 17/297,585

(22) PCT Filed: Oct. 29, 2020

(86) PCT No.: PCT/CN2020/124600
§ 371 (c)(1),
(2) Date: May 27, 2021

(87) PCT Pub. No.: WO2022/077576
PCT Pub. Date: Apr. 21, 2022

(65) Prior Publication Data
US 2022/0310719 A1    Sep. 29, 2022

(30) Foreign Application Priority Data
Oct. 15, 2020   (CN) .......................... 202011102130.8

(51) Int. Cl.
*H10K 50/11*    (2023.01)
*G06F 1/16*    (2006.01)
(Continued)

(52) U.S. Cl.
CPC ........... *H10K 59/12* (2023.02); *G06F 1/1652* (2013.01); *G09F 9/301* (2013.01)

(58) Field of Classification Search
CPC ...... H10K 50/80; H10K 50/86; H10K 50/844; H10K 50/865; H10K 50/868; H10K 71/00; H10K 77/111; H10K 50/11; H10K 50/84; H10H 59/12; H10H 59/40; H10H 59/60; H10H 59/65; H10H 59/121; H10H 59/122;
(Continued)

(56) References Cited

U.S. PATENT DOCUMENTS 10,361,395 B2 *  7/2019  Kajiyama ............ H10K 50/844
2016/0327725 A1 * 11/2016  Im ........................ G02B 6/0038
(Continued)

FOREIGN PATENT DOCUMENTS

CN      107293570      10/2017
CN      107946247       4/2018
(Continued)

*Primary Examiner* — Xiaoliang Chen

(57) ABSTRACT

The application provides a flexible display panel and an electronic device. The flexible display panel includes a plurality of pixel groups. The pixel groups include a plurality of pixels arranged in a first direction. The flexible display panel also includes: a substrate; a semiconductor layer; a gate electrode; a metal part; and a first insulating layer arranged on the metal part. The first insulating layer is provided with at least one first groove, and a position of the first groove corresponds to a position of a gap between two adjacent pixel groups.

20 Claims, 14 Drawing Sheets

(51) Int. Cl.
*G09F 9/30* (2006.01)
*H10K 50/80* (2023.01)
*H10K 50/84* (2023.01)
*H10K 50/844* (2023.01)
*H10K 50/86* (2023.01)
*H10K 59/12* (2023.01)
*H10K 59/121* (2023.01)
*H10K 59/122* (2023.01)
*H10K 59/124* (2023.01)
*H10K 59/126* (2023.01)
*H10K 59/131* (2023.01)
*H10K 59/40* (2023.01)
*H10K 59/60* (2023.01)
*H10K 59/65* (2023.01)
*H10K 71/00* (2023.01)

(58) Field of Classification Search
CPC .. H10H 59/124; H10H 59/126; H10H 59/131; H10H 59/1213; H10H 59/1216; G06F 1/1652; G09F 9/301
USPC ......... 361/749, 750, 679.01, 679.26, 679.27, 361/807, 681; 257/72, 288; 345/75.2, 345/173, 174, 204, 206; 438/75.2, 173, 438/174, 204, 206, 23, 158, 622
See application file for complete search history.

(56) References Cited

U.S. PATENT DOCUMENTS

| | | | |
|---|---|---|---|
| 2017/0077208 A1* | 3/2017 | Park | H10K 59/1213 |
| 2017/0294620 A1* | 10/2017 | Park | H10K 50/865 |
| 2018/0315809 A1* | 11/2018 | Kim | H01L 27/1218 |
| 2019/0131575 A1* | 5/2019 | Peng | H10K 77/111 |
| 2019/0140202 A1* | 5/2019 | Jin | H10K 59/131 |
| 2019/0163304 A1* | 5/2019 | Shim | H01L 27/124 |
| 2019/0165287 A1* | 5/2019 | Tian | H10K 71/00 |
| 2019/0198587 A1* | 6/2019 | Park | H10K 59/122 |
| 2019/0220644 A1* | 7/2019 | Sun | H10K 50/844 |
| 2020/0168850 A1* | 5/2020 | Park | H10K 50/86 |
| 2021/0280825 A1* | 9/2021 | Beon | H10K 59/65 |
| 2023/0024214 A1* | 1/2023 | Tong | H10K 59/124 |

FOREIGN PATENT DOCUMENTS

| | | |
|---|---|---|
| CN | 109037244 | 12/2018 |
| CN | 208208203 | 12/2018 |
| CN | 109300964 | 2/2019 |
| CN | 109860252 | 6/2019 |
| CN | 110620132 | 12/2019 |
| CN | 111430413 | 7/2020 |
| CN | 111682028 | 9/2020 |
| KR | 10-2007-0105092 | 10/2007 |

* cited by examiner

US 11,925,061 B2

FLEXIBLE DISPLAY PANEL AND ELECTRONIC DEVICE

RELATED APPLICATIONS

This application is a National Phase of PCT Patent Application No. PCT/CN2020/124600 having International filing date of Oct. 29, 2020, which claims the benefit of priority of Chinese Patent Application No. 202011102130.8 filed on Oct. 15, 2020. The contents of the above applications are all incorporated by reference as if fully set forth herein in their entirety.

FIELD AND BACKGROUND OF THE INVENTION

The present invention relates to the technical field of display, and particularly relates to a flexible display panel and an electronic device.

With continuous development of flexible display panels, foldable and curlable panels have become a mainstream of the flexible display panels.

Current flexible display panels include multiple pixels. However, as the existing flexible display panels undergo large stress in a process of curling, the pixels are prone to damage, which reduces display effect.

SUMMARY OF THE INVENTION

The invention provides a flexible display panel and an electronic device, which can prevent pixel damage and improve the display effect.

The invention provides a flexible display panel comprising:
  a display area including a pixel array, the pixel array includes a plurality of pixel groups, the pixel group includes a plurality of pixels arranged in a first direction;
  The flexible display panel also comprises:
  Substrate;
  A semiconductor layer is arranged on part of the substrate;
  A gate electrode is arranged on the semiconductor layer;
  The metal part is arranged on the gate electrode, and the position of the metal part corresponds to the position of the gate electrode;
  The first insulating layer is arranged on the metal part;
    The first insulating layer is provided with at least one first groove; The position of the first groove corresponds to the position of the gap between two adjacent pixel groups.

The invention also provides an electronic device, which comprises the flexible display panel.

The flexible display panel and the electronic device of the invention include a display area, including a pixel array. The pixel array includes a plurality of pixel groups, and the pixel groups include a plurality of pixels arranged in a first direction. The flexible display panel also comprises: a substrate; a semiconductor layer arranged on part of the substrate; a gate electrode arranged on the semiconductor layer; a metal part arranged on the gate electrode, and the position of the metal part corresponds to the position of the gate electrode; a first insulating layer arranged on the metal part, wherein the first insulating layer is provided with at least one first groove; and the position of the first groove corresponds to the position of the gap between two adjacent pixel groups. Therefore, the stress on flexible display panel in the process of rolling can be reduced, so as to prevent pixel damage and improve display effect and product yield.

DESCRIPTION OF SPECIFIC EMBODIMENTS OF THE INVENTION

Figure 1:
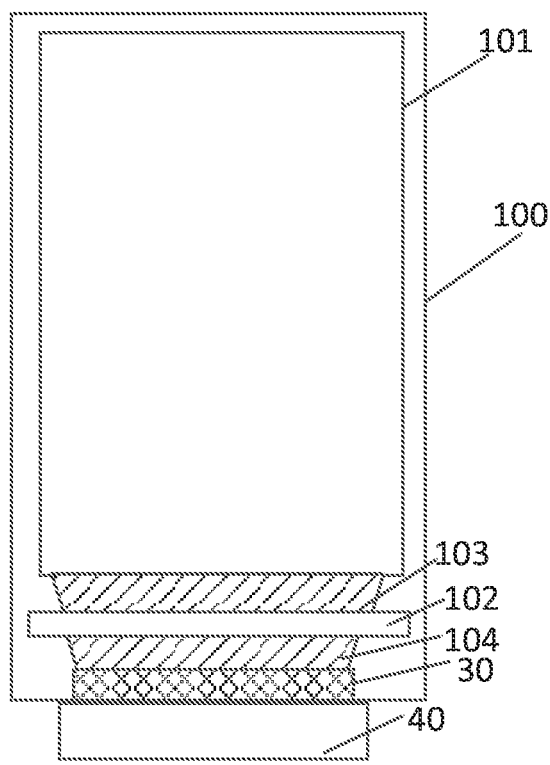
FIG. 1 is a top view of an existing flexible display panel.

The following description of the embodiments is referred to the additional schema to illustrate specific embodiments of the invention that can be implemented. The directional terms mentioned in the invention include "up", "down", "front", "back", "left", "right", "inside", "outside", "side", etc., are only the directions of referring to additional schema. Therefore, the directional terms used are intended to describe and understand the present invention rather than to restrict it. In the diagram, units of similar structure are represented by the same label.

The specifications and claims of the invention and the terms "first" and "second" in the drawings above are used to distinguish different objects and are not used to describe a particular order. In addition, the terms "include" and "have" and any variation of them are intended to cover non-exclusive inclusion.

As shown in FIG. 1, an existing flexible display panel 100 includes a display area 101 and a pad bending area 102, the display area 101 is configured to display images. In an embodiment, the display area 101 includes a plurality of pixels, the pixels include red pixels, green pixels, and blue pixels. The display area 101 may also include a data line and a scan line.

A first routing area 103 is arranged between the pad bending area 102 and the display area 101, a second routing area 104 is provided below the pad bending area 102, the first routing area 103 and the second routing area 104 are provided with external routing, and the external routing in the two routing areas is on the same layer. The pad bending area 102 facilitates curling of the above wiring areas and prevents breakage of external wiring. The routing in the first routing area 103 is connected to the data line in the display area 101.

Figure 2:
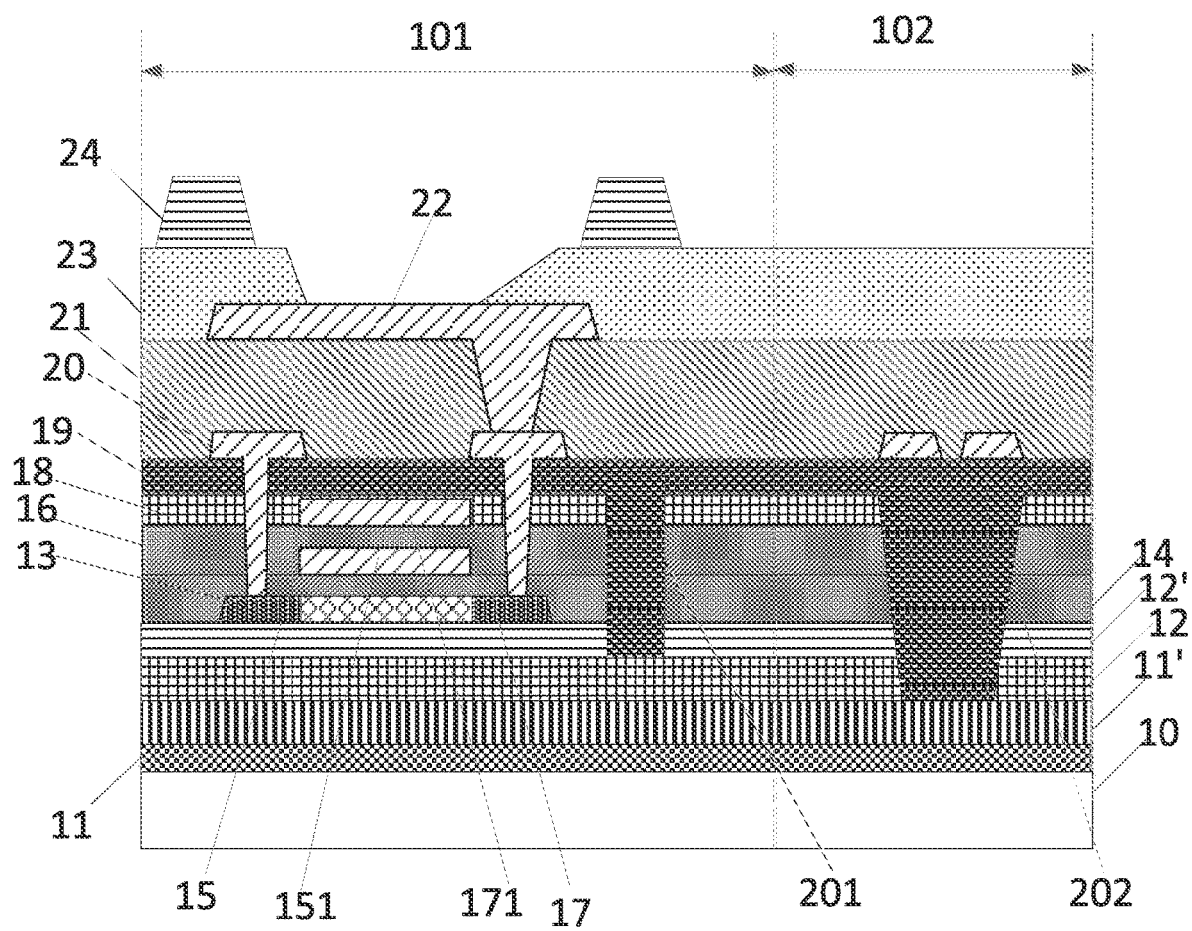
FIG. 2 shows a longitudinal section of the flexible display panel shown in FIG. 1.

A flexible connector 30 is connected with the other end of the external wiring, and a main flexible circuit board 40 is connected with the flexible connector 30. As shown in FIG. 2, a cross-sectional structure of the flexible display panel 100 includes a first flexible substrate 10, a first barrier layer 11, a second flexible substrate 11', a second barrier layer 12, a buffer layer 12', a semiconductor layer 13, a second insulating layer 14, a third metal layer 15, a third insulating layer 16, a second metal layer 17, a first insulating layer 18, and an organic layer 19. The third metal layer 15 comprises a gate electrode 151, the second metal layer 17 includes a metal part 171, a second through hole 201 and a first through hole 202 are arranged on the first insulating layer 18, the second through hole 201 is located in the display area 101, the first through hole 202 is located in the pad bending area 102; in addition, the flexible display panel 100 also includes a first metal layer 20, a flat layer 21, an anode 22, a pixel definition layer 23, and a spacer 24, arranged on the organic layer 19 in sequence.

Figure 3:
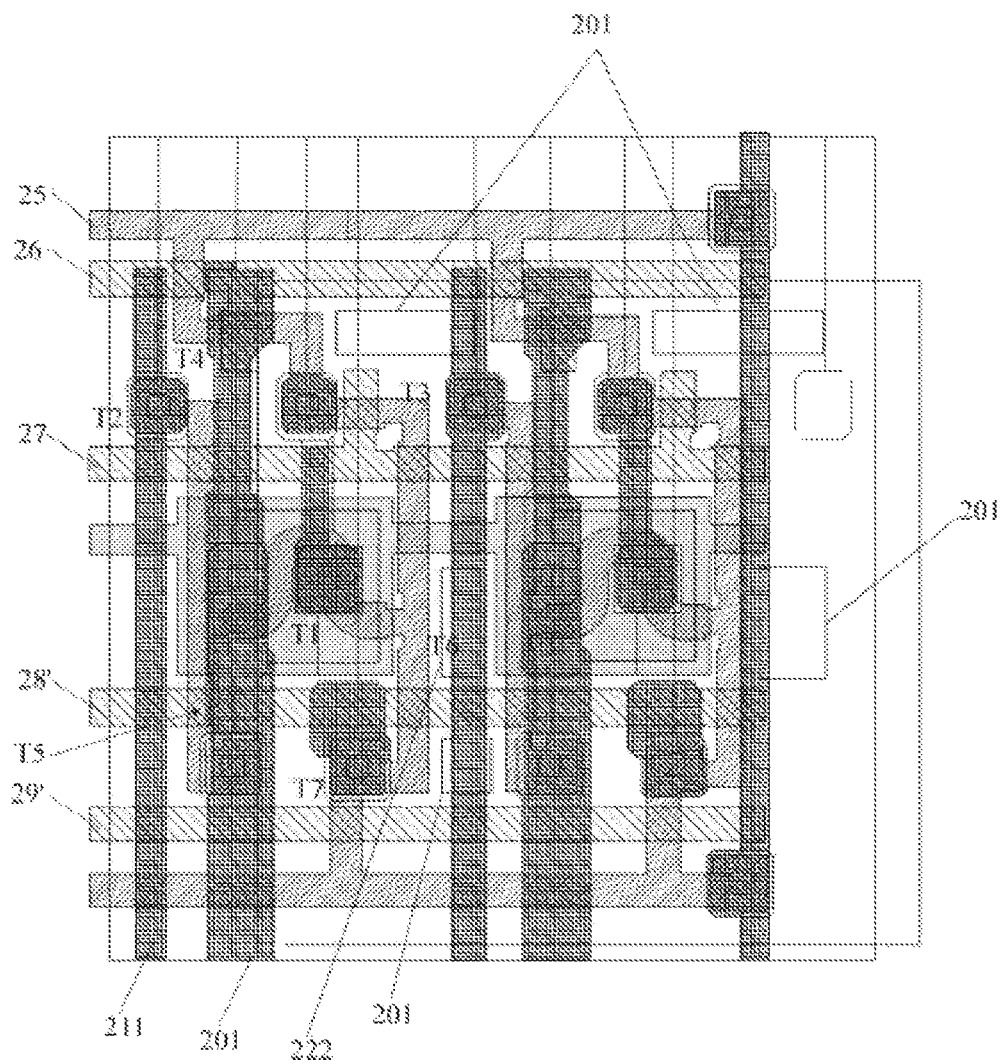
FIG. 3 shows a layout of pixels in the existing flexible display panel.

In combination with FIG. 3, the existing second through hole 201 is obtained by digging holes in the vacant positions within each pixel. The pixels include a first transistor T1 to a seventh transistor T7, a first power line 25, a first scan line 26, a second scan line 27, a third power line 28', a third scan line 29', a data line 211, and a second power line first power line 222. It can be seen that the area of second through hole 201 is small and relatively dispersed, so the metal layer in the pixel is prone to fracture during a rolling process, When the metal layer is fractured, the crack extends to the inorganic layer under the continuous bending stress, which leads to the occurrence of cracks in the inorganic layer.

Figure 4:
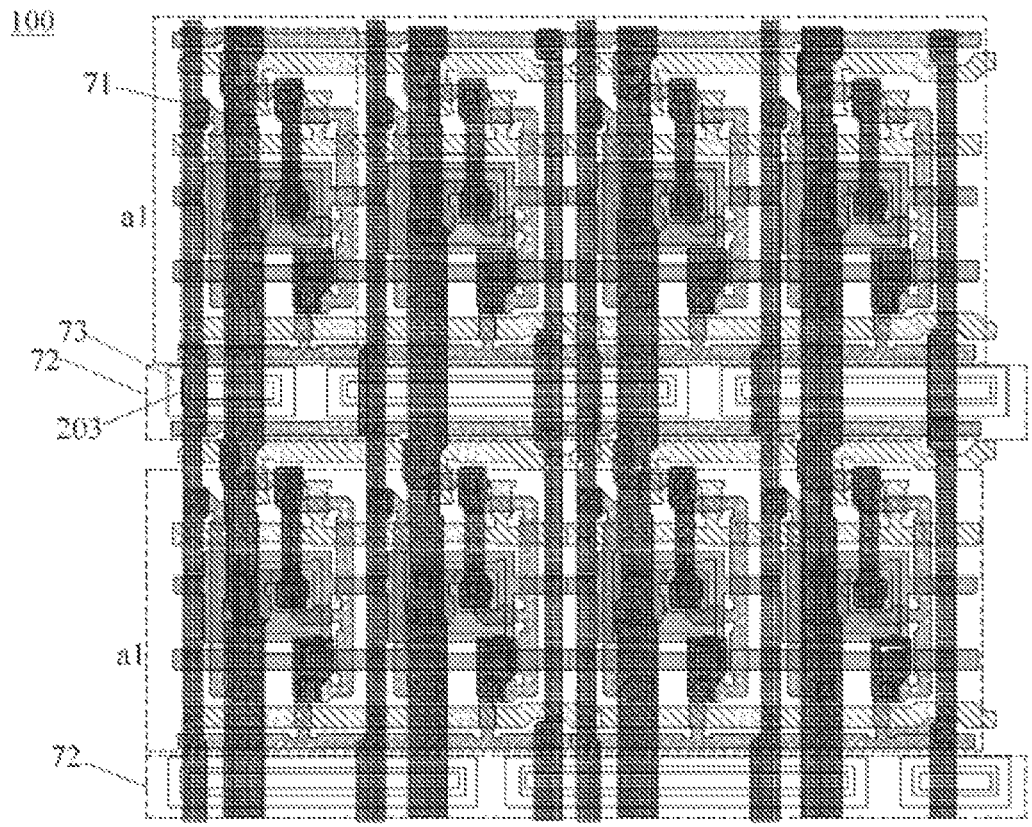
FIG. 4 shows a layout of pixels in a flexible display panel provided by an embodiment of the present invention.

Refer to FIG. 4, which provides a layout of pixels in a flexible display panel by an embodiment of the present invention.

Figure 5:
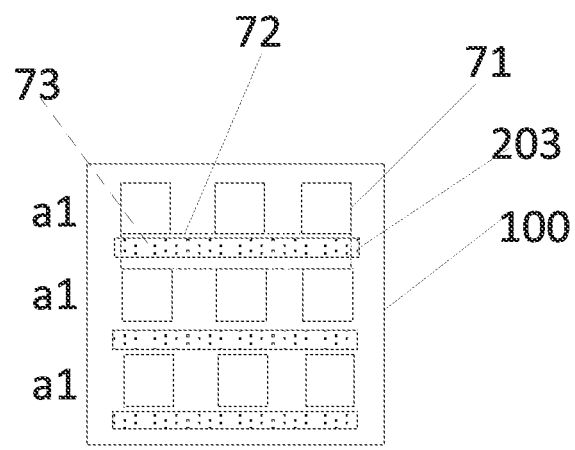
FIG. 5 is an equivalent top view of the display panel shown in FIG. 4.

As shown in FIG. 4 and FIG. 5, the flexible display panel 100 of the invention includes a display area, which includes a pixel array (not marked in the figure). The pixel array includes a plurality of pixel groups a1 including a plurality of pixels 71 arranged in a first direction.

Figure 6:
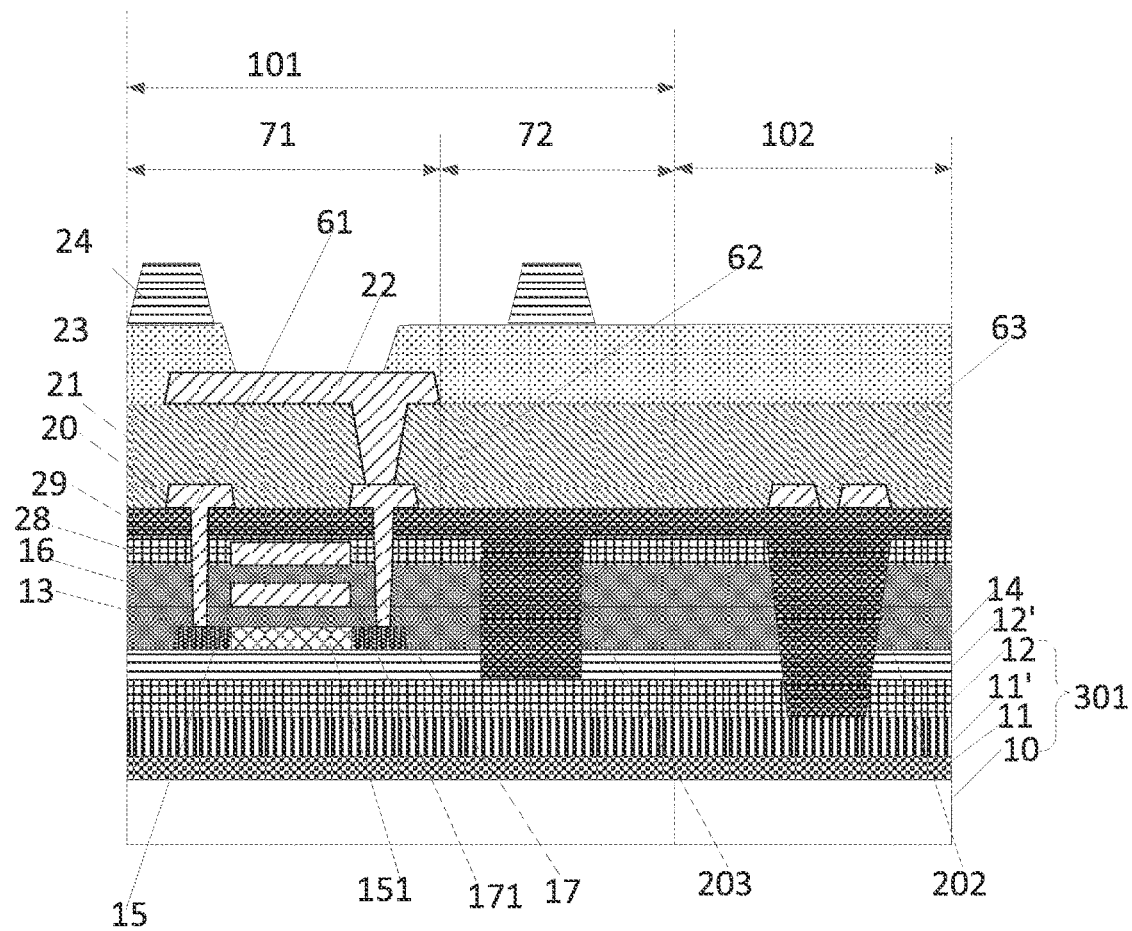
FIG. 6 is a section diagram of the flexible display panel provided by an embodiment of the present invention along a longitudinal direction.

Referring to FIG. 6, the flexible display panel 100 includes a substrate 301, a semiconductor layer 13, a third metal layer 15, a second metal layer 17, and a first insulating layer 28.

The substrate 301 may include a first flexible substrate 10, a first barrier layer 11, a second flexible substrate 11', and a second barrier layer 12; the material of the first flexible substrate 10 may be a flexible material such as polyimide (PI). The first barrier layer 11 can be configured to prevent intrusion of water and oxygen from the first flexible substrate 10. The material of the first barrier layer 11 may be silicon nitride or silicon oxide. The material of the buffer layer 12' can be silicon oxide, silicon nitride, etc., and the material of semiconductor layer 13 can be polysilicon or amorphous silicon.

The semiconductor layer 13 is arranged on part of the substrate 301. In addition, in an embodiment, the flexible display panel 100 further comprises a buffer layer 12' and a second insulating layer 14. Specifically, the semiconductor layer 13 is arranged on the buffer layer 12' in the pixel 71; the second insulating layer 14 is located on the semiconductor layer 13. The material of the second insulating layer 14 may be SiOx or SiNx.

The third metal layer 15 includes a gate electrode 151 arranged on the second insulating layer 14.

The second metal layer 17 includes a metal part 171 arranged on the gate electrode 151, the position of the metal part 171 corresponds to the position of the gate electrode 151. The material of the gate electrode 151 and the metal part 171 may be copper, aluminum, and the like.

In combination with FIG. 5, the first insulating layer 28 is arranged on the metal part 171; the first insulating layer 28 is provided with at least one first groove 203; the position of the first groove 203 corresponds to the position of a gap 72 between the two adjacent pixel groups a1.

In some embodiments, as shown in FIG. 4 and FIG. 5, a first groove 203 is arranged on the first insulating layer 28, the first groove 203 covers a gap 72 between two adjacent pixel groups a1. In other words, the length of the first groove 203 is greater than or equal to the length of the gap 72 between two adjacent pixel groups a1. The direction in which the length is located is the same as the first direction. For example, in an embodiment, when the pixel group a1 is arranged along the transverse direction, the length is the size in the transverse direction. When the display panel is rolled, the first direction is parallel to the direction of the reel.

Figure 7:
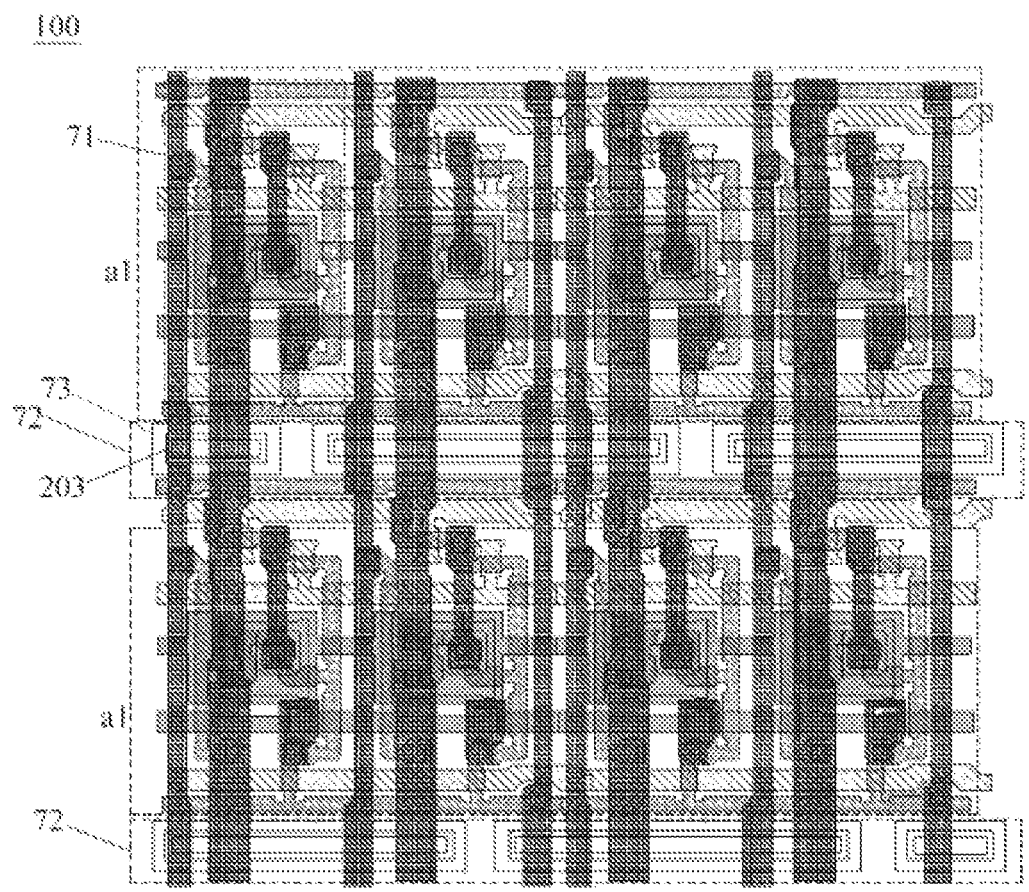
FIG. 7 shows a layout of pixels in a flexible display panel provided by another embodiment of the present invention.
Figure 8:
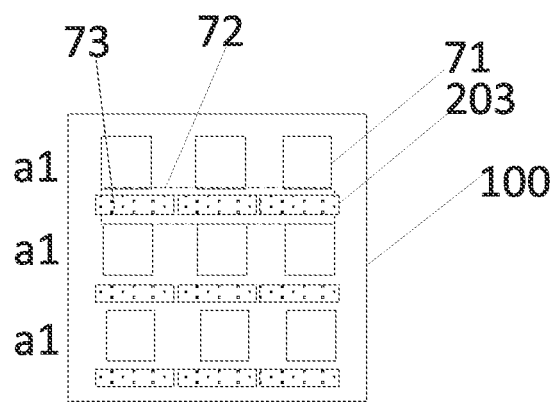
FIG. 8 is an equivalent top view of the display panel shown in FIG. 7.

In some embodiments, as shown in FIG. 7 and FIG. 8, a plurality of first grooves 203 are arranged on the first insulating layer 28, the first grooves 203 correspond to the pixel 71, the length of the first grooves 203 is greater than or equal to the length of the corresponding pixel 71. In a preferred embodiment, an interval is arranged between the two adjacent first grooves 203. In an embodiment, the first grooves 203 penetrate the first insulating layer 28 and the buffer layer 12'.

Of course, the shape of the first groove 203 is not limited to this. In an embodiment, in order to further reduce the bending stress, the first groove 203 is filled with an organic material 73. The organic material 73 can be one of silicon-based organic matter, polymethylmethacrylate and other high polymer, or organic resin. In another embodiment, the first groove 203 may not be filled with organic materials. In an embodiment, combined with FIG. 6, the flexible display panel 100 includes a third insulating layer 16 and a first metal layer 20.

The third insulating layer 16 is arranged between the third metal layer 15 and the second metal layer 17.

The first metal layer 20 is arranged on the first insulating layer 28, the first metal layer 20 comprises a source electrode 61 and a drain electrode 62, the source electrode 61 and the drain electrode 62 are located in the pixel 71.

Figure 9:
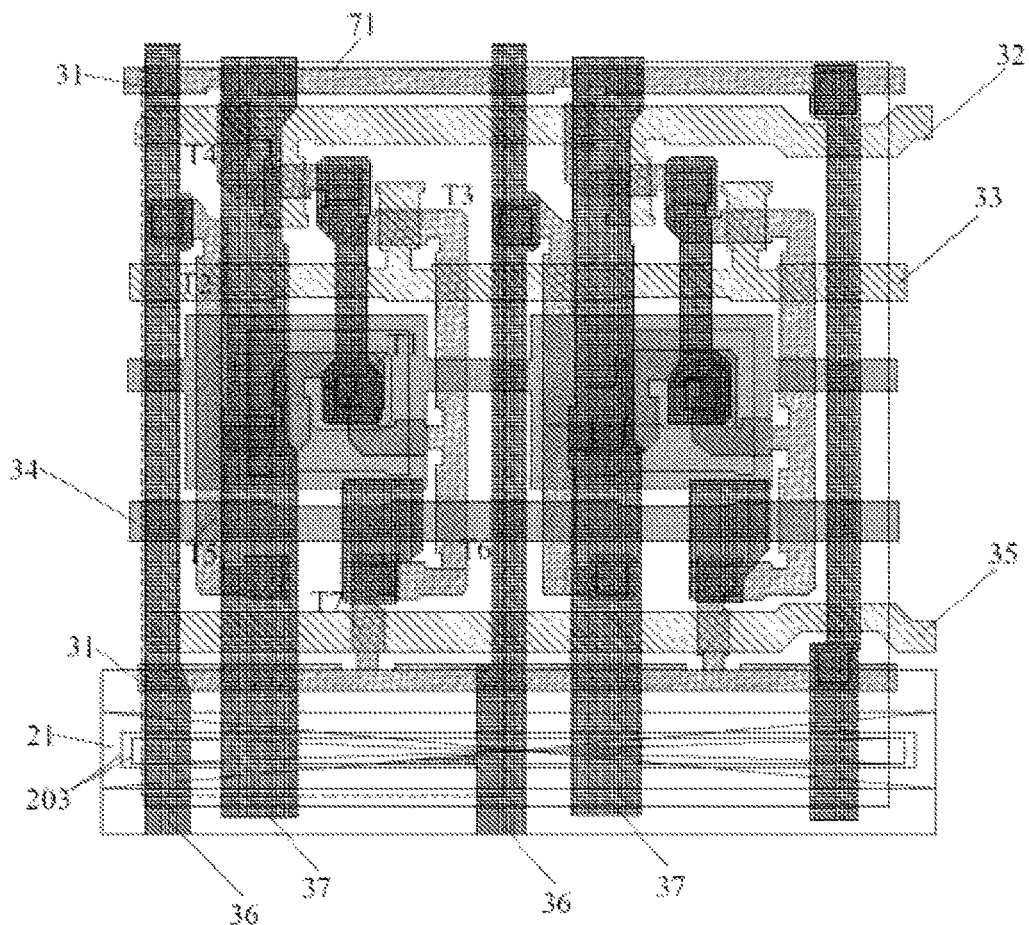
FIG. 9 is an enlarged layout of the pixels in the flexible display panel provided in one embodiment of the present invention.

As shown in FIG. 9, the flexible display panel 100 includes the second power line 31, the first scan line 32, the second scan line 33, the third power line 34, the third scan line 35, the data line 36, and the first power line 37. The second power line 31 can be set in the same layer as the semiconductor layer 17, and the first scan line 32, the second scan line 33, and the third scan line 35 can be set in the same layer as the gate electrode 151, the third power line 34 can be set in the same layer as the metal part 171, while the data line 36 and the first power line 37 can be set in the same layer as the source electrode 61 and the drain electrode 62, That is, the data line 36 and the first power line 37 are located in the first metal layer 20.

Figure 10:
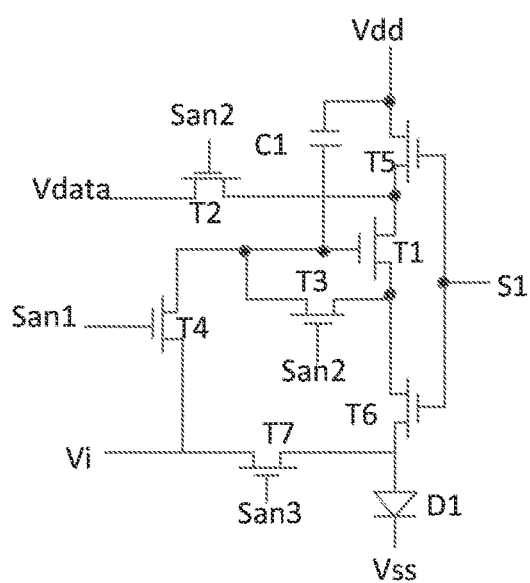
FIG. 10 is a circuit diagram of a pixel provided by an embodiment of the present invention.

Combining with FIG. 10, the pixel 71 includes an organic light emitting diode D1, and a first transistor T1 to a seventh transistor T7. The gate electrode of the second transistor T2 is connected with the second scan line 33, the second scan line 33 inputs a second scan signal Scan2, the source electrode of the second transistor T2 is connected with the data line 36, the data line 36 has a data voltage Vdata, the drain electrode of the second transistor T2 is connected with the source electrode of the first transistor T1, the gate electrode of the fourth transistor T4 is connected with the first scan line 32, the input of the first scan line 32 is Scan1, and the source electrode of the fourth transistor T4 is connected with the second power line 31. The input of the second power line 31 is the first power voltage Vi, the drain electrode of the fourth transistor T4 is connected with the source electrode of the third transistor T3 and the gate electrode of the first transistor T1. The gate electrode of the third transistor T3 is connected to the second scan line 33. The drain electrode of the third transistor T3 is connected to the drain electrode of the first transistor T1; the gate electrode of the fifth transistor T5 is connected with the third power line 34. The third power line 34 is configured to input the luminescent enable signal S1, the source electrode of the fifth transistor T5 is connected to the first power line 37, and the first power line 37 is configured to input the second supply voltage VDD. The drain electrode of the fifth transistor T5 is connected with the source electrode of the first transistor T1. One end of the capacitor C1 is connected with the source electrode of the fifth transistor T5, and the other end of the capacitor C1 is connected with the gate electrode of the first transistor T1.

The gate electrode of transistor T6 is connected to the third power line 34, and the source electrode of transistor T6 is connected to the drain electrode of transistor T3, the drain electrode of transistor T6 is connected to the anode of the light emitting element D1. The gate of the seventh transistor T7 is connected to the third scan line 35, which inputs the third scan signal Scan3. The source electrode of the seventh transistor T7 is connected to the second power line 31, the drain electrode of the seventh transistor T7 is connected to the anode of the light-emitting element D1, and the cathode of the light-emitting element D1 is connected to the low-level power supply voltage Vss.

Combined with FIG. 6, the flexible display panel 100 of the present invention includes: display area 101, which includes the gap 72 between pixel 71 and two adjacent pixel groups al (hereinafter referred to as the gap region), the gap region 72 is larger than the preset area, that is, the gap region is increased. In combination with FIG. 4, the area of the pixel 71 is compressed or reduced to increase the gap region 72. In the specific embodiment, the space between the metal lines in the pixel 71 or the width of the metal lines can be reduced to reduce the area of the pixel 71, and the specific methods are not limited.

In another embodiment, returning to FIG. 6, the flexible display panel 100 also includes a pad bending area 102 and a metal wiring.

A first through hole 202 is also arranged on the first insulating layer 28 in the pad bending area 102, and first through hole 202 is filled with organic materials.

The metal wiring 63 is arranged on the organic material in the first through hole 202. In an embodiment, a plurality of through holes 81 may also be arranged on the metal wiring 63. In another embodiment, the metal wiring 63 may not be provided with a through hole. In a preferred embodiment, the depth of the first through hole 202 may be greater than the depth of the first groove 203. In order to simplify the manufacturing process, the metal wiring 63 is located in the first metal layer 20.

Figure 11:
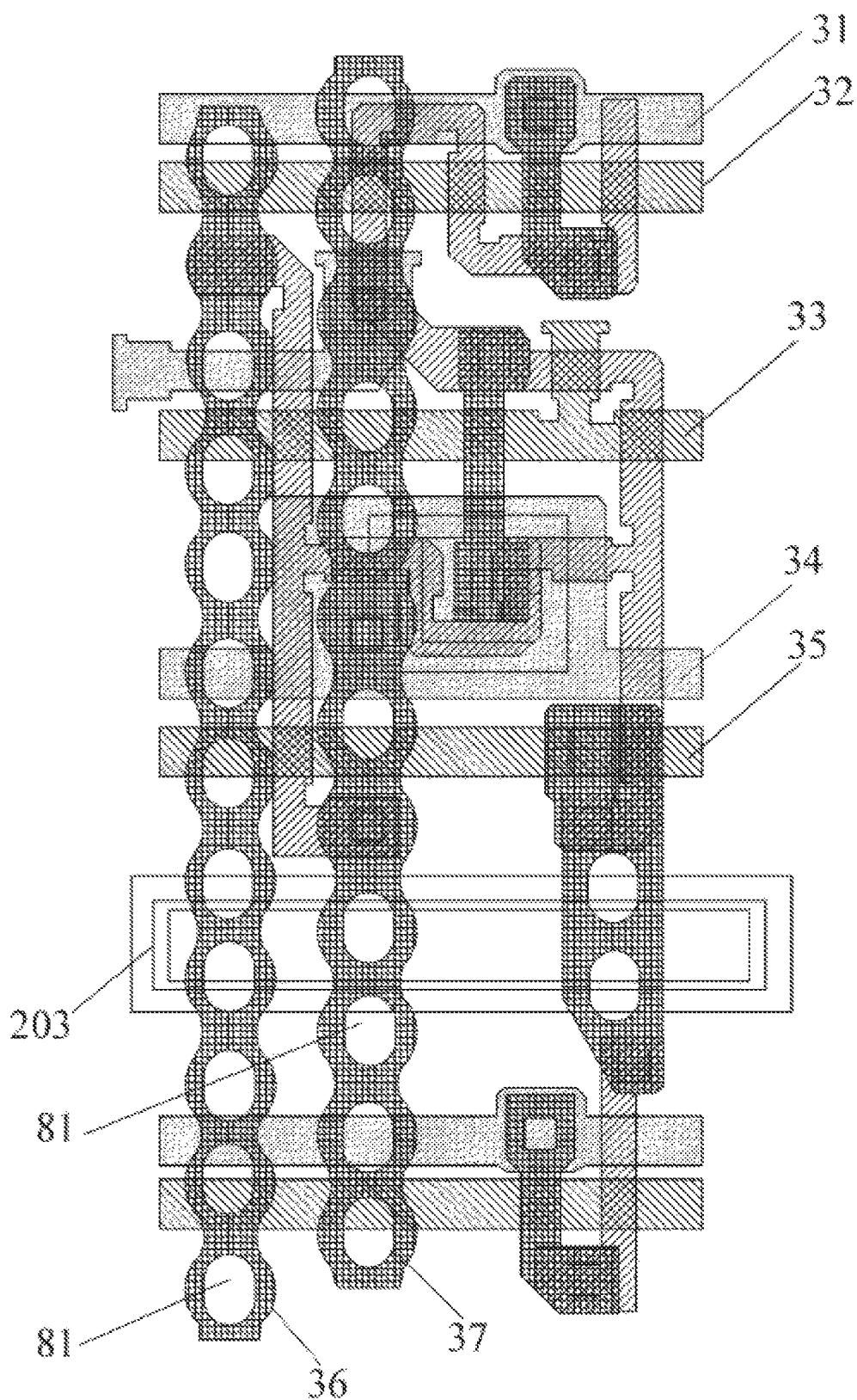
FIG. 11 shows a layout of a single pixel provided by an embodiment of the present invention.
Figure 12:
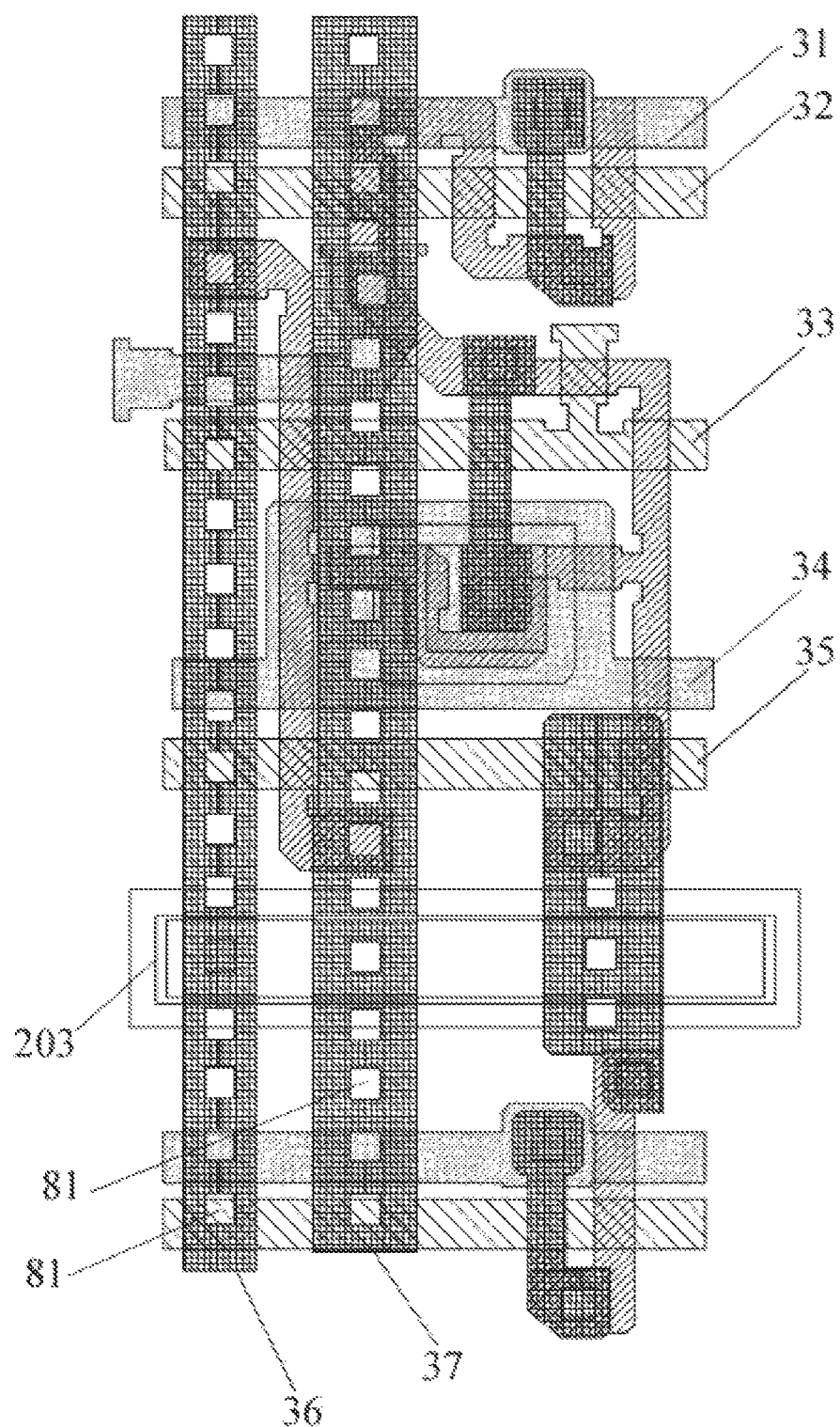
FIG. 12 is a layout of a single pixel provided by another embodiment of the present invention.
Figure 13:
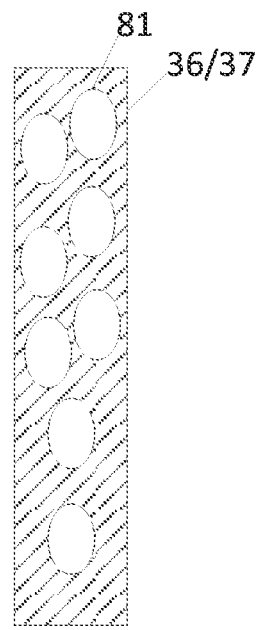
FIG. 13 is a structural diagram of a data line or a first power line provided by an embodiment of the present invention.

As shown in FIGS. 11 and 12, a plurality of through holes 81 are arranged on the data line 36 and/or the first power line 37. In some embodiments, as shown in FIG. 11, the external surface of the data line 36 and/or the first power line 37 is provided with a concave-convex structure so as to further prevent the signal line from breaking. In an embodiment, the position of the protrusion can correspond to the position of the through hole 81, the position of the depression corresponds to the position of the gap between the two adjacent through holes 81, and the specific mode is unlimited. In other embodiments, as shown in FIG. 12, the external surface of the data line 36 and/or the first power line 37 may not be configured with a concave-convex structure. In some embodiments, taking the outer surface of the data line 36 and/or the first power line 37 not provided with the concave-convex structure as an example, in an embodiment, as shown in FIG. 13, the density of the through hole 81 close to the setting side is greater than that of the through hole 81 far away from the setting side. The setting side is, for example, the side close to the start of the roll. For example, if the upper side of the data line or the first power line is close to the roll starting end, the density of through hole 81 on the upper side of the data line 36 is higher than that on the lower side of the data line 36. As the stress on the side close to the roll starting end is larger, more through holes are set on the side to further alleviate and reduce the stress.

Figure 14:
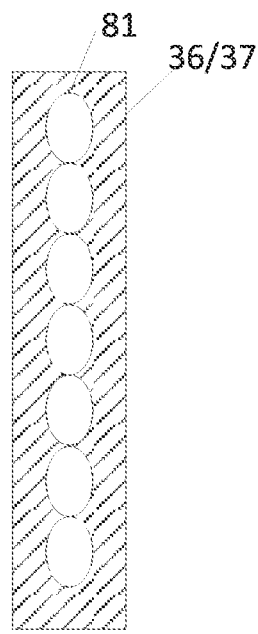
FIG. 14 is a structural diagram of a data line or a first power line provided by another embodiment of the present invention.

In some embodiments, as shown in FIG. 14, two adjacent through holes 81 touch each other, In other embodiments, the two adjacent through holes 81 may be set at an interval or partially overlapped, and the specific arrangement is not limited to this.

Figure 15:
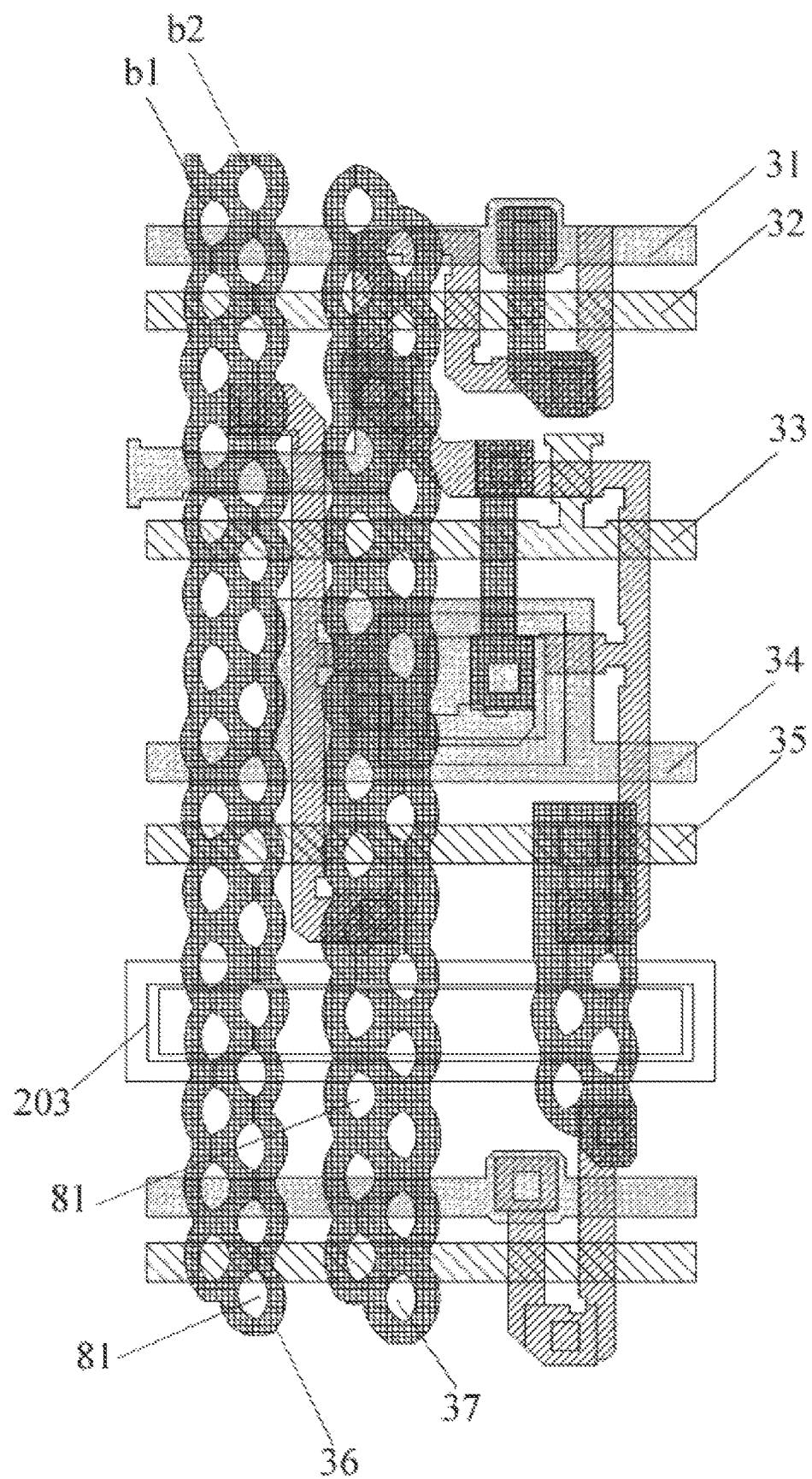
FIG. 15 is a layout of a single pixel provided by another embodiment of the present invention.
Figure 16:
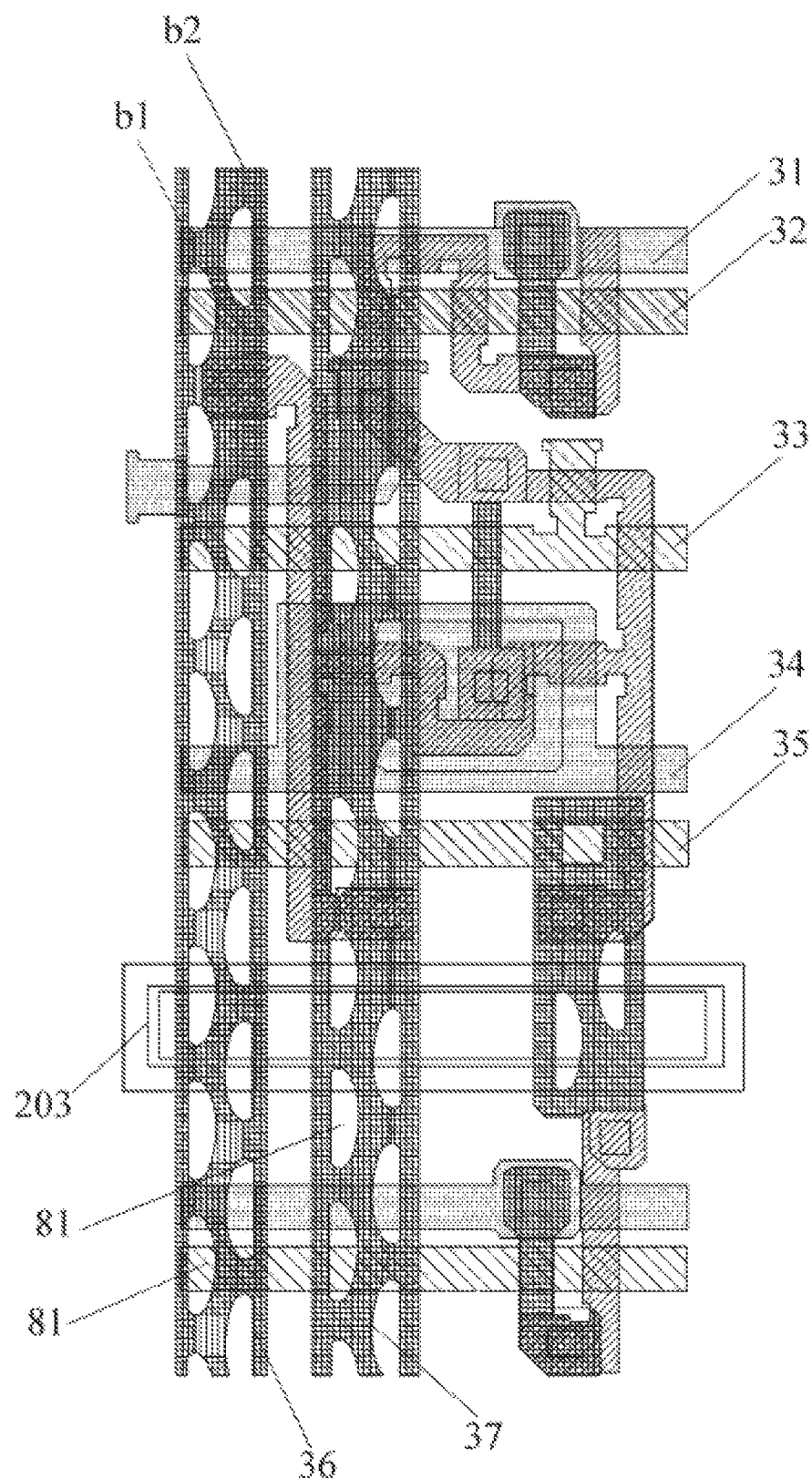
FIG. 16 is a layout of a single pixel provided by yet another embodiment of the present invention.

In the other embodiment, as shown in FIG. 15 or FIG. 16, the plurality of through holes 81 form the first hole column b1 and the second hole column b2. The first hole column b1 and the second hole column b2 both include a plurality of through holes 81, and the through hole 81 in the first hole column b1 and the through hole 81 in the second hole column b2 are interlaced. In an embodiment, the through hole 81 in the first hole column b1 is located at the gap between two adjacent through holes 81 in the second hole column b2. In other embodiments, the through hole 81 in the first hole column b1 partially overlaps with the two adjacent through holes 81 in the second hole column b2, of course, the through hole arrangement is not limited to this. More holes can be set on the data line 36 or the first power line 37. As shown in FIG. 11 to FIG. 16, the shape of the through hole 81 can be at least one of circular, elliptical, or rectangular. Of course, it is understandable that the shape of the through hole 81 may also include semicircular, plate elliptical, or trapezoidal, and is not specifically defined. In a preferred embodiment, the structure of the through hole on the metal wiring may be the same as that of the through hole on the data line or the second power line.

Figure 17:
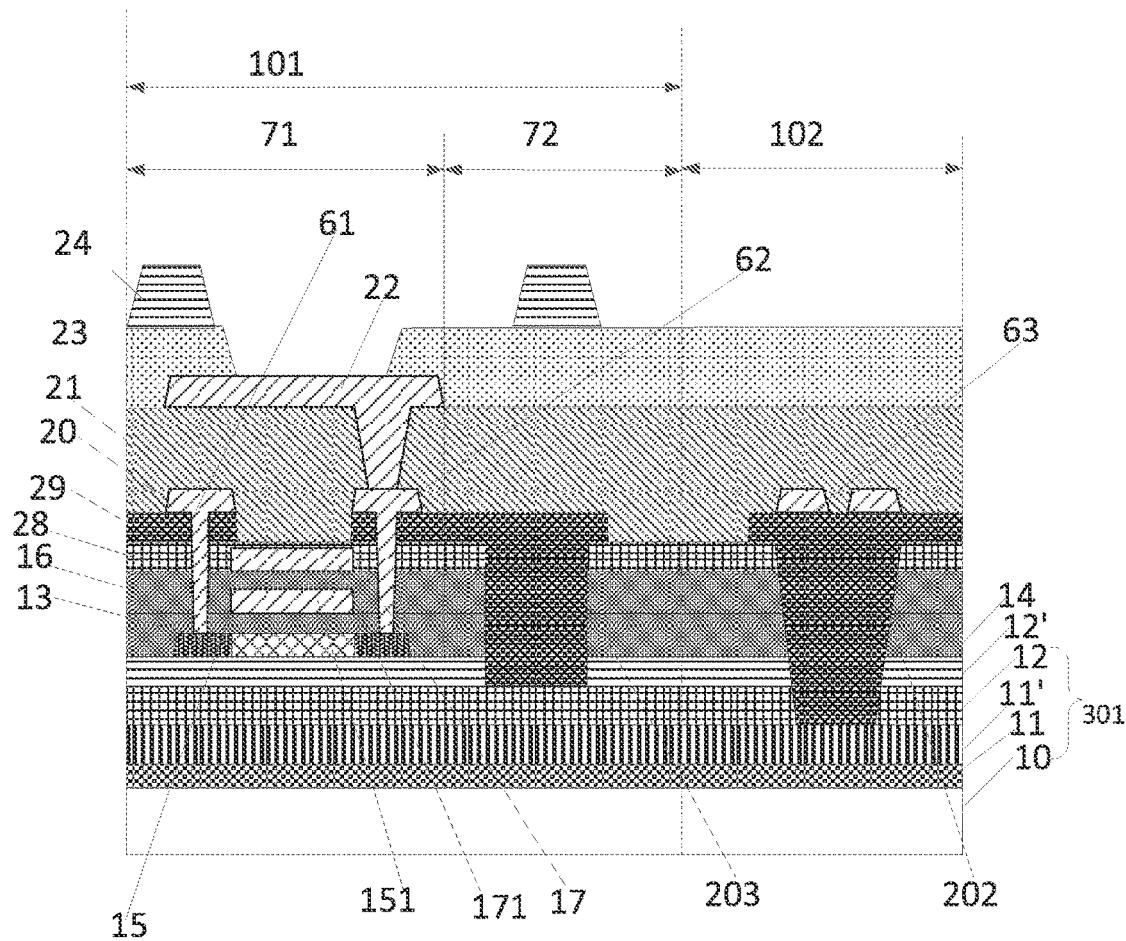
FIG. 17 is a section diagram of the flexible display panel provided by another embodiment of the present invention.
Figure 18:
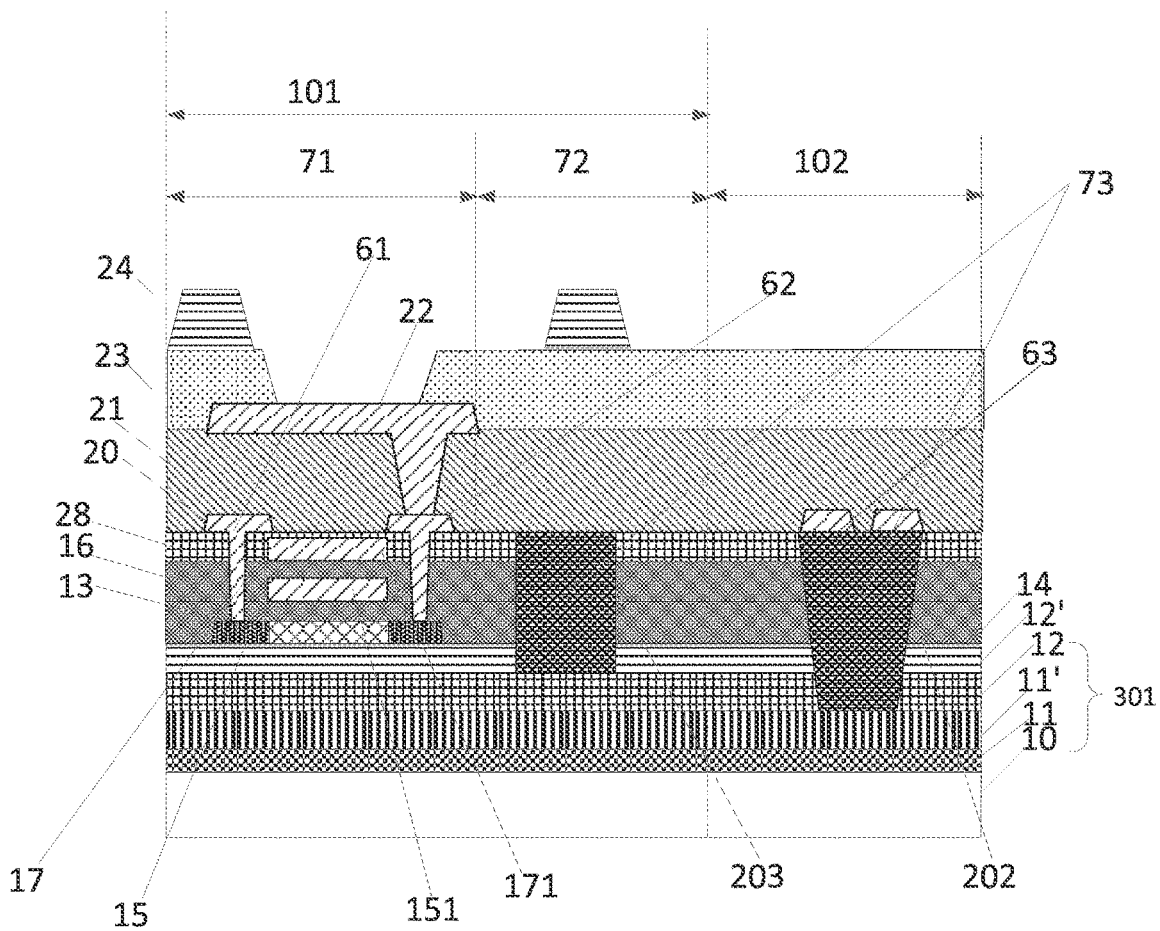
FIG. 18 is a section diagram of the flexible display panel provided by yet another embodiment of the present invention.

In an embodiment, returning to FIG. 6, the flexible display panel 100 may also include: the organic layer 29 is arranged on the first insulating layer 28, the first groove 203, and the first through hole 202. In another embodiment, as shown in FIG. 17, the organic layer 29 is arranged on part of the first insulating layer 28, Since the organic layer covers part of the first insulating layer, the contact area between the flat layer can be reduced, thus preventing the peeling of the flat layer and improving the yield and service life of the product. In another embodiment, as shown in FIG. 18, the flexible display panel may also include the organic layer 29 in order to better prevent the peeling of the flat layer. In other words, organic material 73 is filled in the first groove 203 and the first through hole 202. The organic material can be one of the silica-based organic compounds, polymethyl methacrylate, or organic resin.

Since the first groove is set at the gap between two adjacent pixel groups, the stress on the flexible display panel during the rolling process can be reduced, so as to prevent pixel damage and improve the display effect and product yield.

Figure 19:
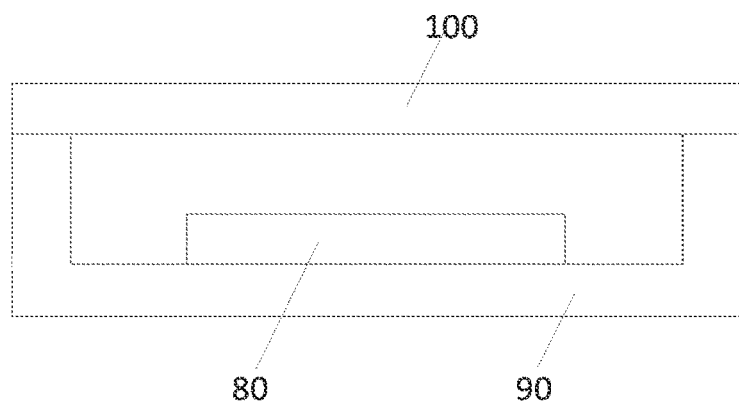
FIG. 19 is a structural diagram of an electronic device provided by an embodiment of the present invention.

Refer to FIG. 19, which is a schematic diagram of an electronic device provided by the invention.

The electronic device 200 may include any of the flexible display panel 100, control circuit 80, and housing 90 mentioned above. It should be noted that the electronic device 200 shown in FIG. 19 is not limited to the above contents, but can also include other devices, such as camera, antenna structure, fingerprint unlock module, etc.

Among them, the flexible display panel 100 is arranged on the housing 90.

In some embodiments, the flexible display panel 100 may be fixed to the housing 90, and the flexible display panel 100 and the housing 90 form a confined space to accommodate devices such as the control circuit 80.

In some embodiments, the housing 90 may be made of a flexible material, such as a plastic shell or a silicone shell.

The control circuit 80 is installed in the housing 90, and the control circuit may be the main board of the electronic device 200. The control circuit 80 may be integrated with one, two, or more of the functional components such as the battery, antenna structure, microphone, speaker, headphone jack, universal serial bus interface, camera, distance sensor, ambient light sensor, receiver, and processor.

Among them, the flexible display panel 100 is installed in the housing 90, and at the same time, the flexible display panel 100 is electrically connected to the control circuit 80 to form the display surface of the electronic device 200. The flexible display panel 100 can include display areas and non-display areas. This display area can be configured to display images of the electronic device 200 or provide touch control for users. This non-display area can be configured to set up various functional components.

The electronic device includes but is not limited to mobile phones, tablet computers, computer monitors, game consoles, television sets, display screens, wearable devices, and other household electrical appliances or household electrical appliances having display functions.

The flexible display panel and the electronic device of the invention include a display area, including a pixel array. The pixel array includes a plurality of pixel groups. The pixel groups include a plurality of pixels arranged in a first direction. The flexible display panel also comprises: a substrate; a semiconductor layer arranged on part of the substrate; a gate electrode arranged on the semiconductor layer; a metal part arranged on the gate electrode, and the position of the metal part corresponds to the position of the gate electrode; a first insulating layer arranged on the metal part, wherein the first insulating layer is provided with at least one first groove, and the position of the first groove corresponds to the position of the gap between two adjacent pixel groups. Therefore, the stress on the flexible display panel in the process of rolling can be reduced, so as to prevent pixel damage and improve the display effect and product yield.

The flexible display panel and the electronic device provided by the invention are described in detail above. In this paper, the principle and implementation mode of the invention are described with specific individual cases. The explanation of the above embodiments is only used to help understand the invention. At the same time, for the technical personnel in this field, according to the idea of the invention, there will be changes in the specific implementation mode and application scope. In summary, the contents of this specification shall not be interpreted as a restriction of the invention.

What is claimed is:

1. A flexible display panel, comprising:
    a display area, comprising a pixel array, wherein the pixel array includes a plurality of pixel groups, and the pixel groups include a plurality of pixels arranged in a first direction;
    the flexible display panel, further comprising:
    a substrate;
    a semiconductor layer arranged on part of the substrate;
    a gate electrode arranged on the semiconductor layer;
    a metal part arranged on the gate electrode, wherein a position of the metal part corresponds to a position of the gate electrode;
    a first insulating layer arranged on the metal part; and
    at least one first groove defined on the first insulating layer, wherein a position of the first groove corresponds to a position of a gap between two adjacent pixel groups, the first groove at the gap comprises a plurality of segments, every adjacent two of the segments have an interval and different lengths, and the interval in the gap and the interval in another adjacent gap are staggered in a direction perpendicular to the first direction.

2. The flexible display panel according to claim 1, wherein the at least one first groove comprises a plurality of first grooves, the first grooves correspond to the pixels, a length of the first grooves is greater than or equal to a length of the corresponding pixels, and the length of the first grooves is in the same direction as the first direction.

3. The flexible display panel according to claim 2, wherein two adjacent first grooves are disposed at an interval.

4. The flexible display panel according to claim 1, wherein the first insulating layer is provided with one first groove, and the first groove covers the gap between the two adjacent pixel groups.

5. The flexible display panel according to claim 1, wherein the first groove is filled with organic materials.

6. The flexible display panel according to claim 1, wherein the flexible display panel further includes a data line and a first power line, the data line is provided with a plurality of through holes and/or the first power line is provided with the plurality of through holes.

7. The flexible display panel according to claim 6, wherein an external surface of the data line and/or an external surface of the first power line is provided with a concave-convex structure.

8. The flexible display panel according to claim 6, wherein a density of the through holes close to a setting side is greater than a density of the through holes far away from the setting side.

9. The flexible display panel according to claim 6, wherein the plurality of through holes form a first hole column and a second hole column, the first hole column and the second hole column both include the plurality of through holes, and the through holes in the first hole column and the through holes in the second hole column are interlaced.

10. The flexible display panel according to claim 9, wherein the through holes in the first hole column are located at a gap between two adjacent through holes in the second hole column.

11. The flexible display panel according to claim 6, wherein two adjacent through holes are connected with each other.

12. The flexible display panel according to claim 6, wherein the flexible display panel further includes:
 a first metal layer arranged on the first insulating layer, the first metal layer comprising a source electrode and a drain electrode; and
 wherein the data line and the first power line are located in the first metal layer.

13. The flexible display panel according to claim 1, wherein an overlooking shape of the first groove includes at least one of circular, rectangular, or trapezoidal.

14. The flexible display panel according to claim 1, wherein the flexible display panel further includes:
 a buffer layer arranged between the substrate and the semiconductor layer;
 wherein the first groove penetrates through the first insulating layer and the buffer layer.

15. The flexible display panel according to claim 1, wherein the flexible display panel further includes a pad bending area;
 a first through hole is arranged on the first insulating layer located in the pad bending area, the first through hole is filled with organic material, and a depth of the first through hole is greater than a depth of the first groove.

16. The flexible display panel according to claim 15, wherein the flexible display panel further includes:
 a metal wiring arranged on the organic material in the first through hole.

17. The flexible display panel according to claim 16, wherein the metal wiring is provided with a through hole.

18. The flexible display panel according to claim 16, wherein the flexible display panel further includes a first metal layer, and the metal wiring is located in the first metal layer.

19. The flexible display panel according to claim 1, wherein when the flexible display panel is rolled, the first direction is parallel to a direction of a reel of the flexible display panel.

20. An electronic device, comprising the flexible display panel as described in claim 1.

* * * * *